United States Patent
Li et al.

(10) Patent No.: US 9,973,176 B2
(45) Date of Patent: May 15, 2018

(54) CIRCUITS FOR DIGITAL AND ANALOG CONTROLLED OSCILLATORS

(71) Applicant: Intel Corporation, Santa Clara, CA (US)

(72) Inventors: Shenggao Li, Pleasanton, CA (US); Sujatha B. Gowder, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/583,679

(22) Filed: Dec. 27, 2014

(65) Prior Publication Data

US 2016/0191026 A1    Jun. 30, 2016

(51) Int. Cl.
| | |
|---|---|
| *H03K 3/03* | (2006.01) |
| *H03B 5/00* | (2006.01) |
| *H03L 7/099* | (2006.01) |
| *H03B 5/12* | (2006.01) |
| *H03L 7/18* | (2006.01) |
| *H03L 7/093* | (2006.01) |
| *H03K 5/00* | (2006.01) |
| *H03L 7/07* | (2006.01) |

(52) U.S. Cl.
CPC ............ *H03K 3/0315* (2013.01); *H03B 5/00* (2013.01); *H03B 5/124* (2013.01); *H03B 5/1246* (2013.01); *H03B 5/1278* (2013.01); *H03K 5/00* (2013.01); *H03L 7/07* (2013.01); *H03L 7/093* (2013.01); *H03L 7/0995* (2013.01); *H03L 7/18* (2013.01)

(58) Field of Classification Search
CPC ...... H03K 5/00; H03K 17/687; H03K 3/0315; H03L 7/0995; H03L 7/18; H03L 7/093; H03B 5/124; H03B 5/1246; H03B 5/1278; H03B 5/00

USPC .............. 331/177 V, 175, 57, 183 V, 183, 34
See application file for complete search history.

(56) References Cited

U.S. PATENT DOCUMENTS

| | | | | |
|---|---|---|---|---|
| 5,666,088 | A | * | 9/1997 | Penza ..................... H03K 3/013 331/175 |
| 5,864,258 | A | * | 1/1999 | Cusinato ............... H03K 3/013 331/177 R |
| 9,455,727 | B2 | | 9/2016 | Li et al. |
| 2002/0149433 | A1 | * | 10/2002 | Ingino, Jr. ........... H03K 3/0315 331/57 |

(Continued)

OTHER PUBLICATIONS

Wu, T. et al., "An On-Chip Calibration Technique for Reducing Supply Voltage Sensitivity in Ring Oscillators", Digest of Technical Papers. 2006 Symposium on VLSI Circuits, 2006. Jun. 15-17, 2006, Honolulu, HI, USA; DOI: 10.1109/VLSIC.2006.1705330; Date Added to IEEE Xplore: Feb. 20, 2007.

*Primary Examiner* — Arnold Kinkead
(74) *Attorney, Agent, or Firm* — Green, Howard & Mughal LLP

(57) ABSTRACT

A circuit may comprise a first node, a ring oscillator, a regulator, and a Kvcc compensation circuit. The first node may be a supply node to provide a supply voltage for the circuit. The ring oscillator may be formed from inverters. The regulator may use a single transistor between the first node and a second node for powering the oscillator. The K compensation circuit may be used to provide to the oscillator a variable capacitive load that is dependent on the supply at the first supply node, and it may drag oscillator frequency down when the first node supply goes up.

25 Claims, 3 Drawing Sheets

(56) References Cited

U.S. PATENT DOCUMENTS

2010/0295580 A1* 11/2010 Liu .................. H03M 1/60
327/77
2011/0063004 A1* 3/2011 Chen ................. H03L 7/093
327/157

* cited by examiner

CIRCUITS FOR DIGITAL AND ANALOG CONTROLLED OSCILLATORS

FIELD OF THE INVENTION

The present invention relates generally to phase locked loop circuits including all digital phase locked loop circuits, and in particular, relates to ring oscillator control circuits in high speed applications.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Oscillators including both VCO (voltage controlled analog oscillators) and DCOs (digitally controlled oscillators are commonly used for various applications including as part of PLLs (phase locked loops) to generate precise clock signals for clocking logic and for IO interfaces. Unfortunately, it is getting ever more difficult to build oscillators that can generate the high frequencies demanded today, especially in platforms requiring ever smaller supply voltages.

Some embodiments of the present invention are directed to reducing the supply noise sensitivity of ring oscillators including with both voltage controlled oscillators (VCOs) and digitally controlled oscillators (DCOs). Ring-oscillators are notorious for their high supply noise sensitivity (aka, high Kvcc), in addition to their high intrinsic jitter. (Kvcc is defined as $\Delta f/\Delta V$). As an example, for a 5 GHz center frequency, an oscillator Kvcc may be about 5.5 GHz/Volt. Such high Kvcc generally dictates a voltage regulator with very high PSRR to suppress supply noise. Because of the high Kvcc, the thermal and flicker noise of the regulator will have a strong impact to the overall oscillator jitter, and should NOT be overlooked.

Figure 1:
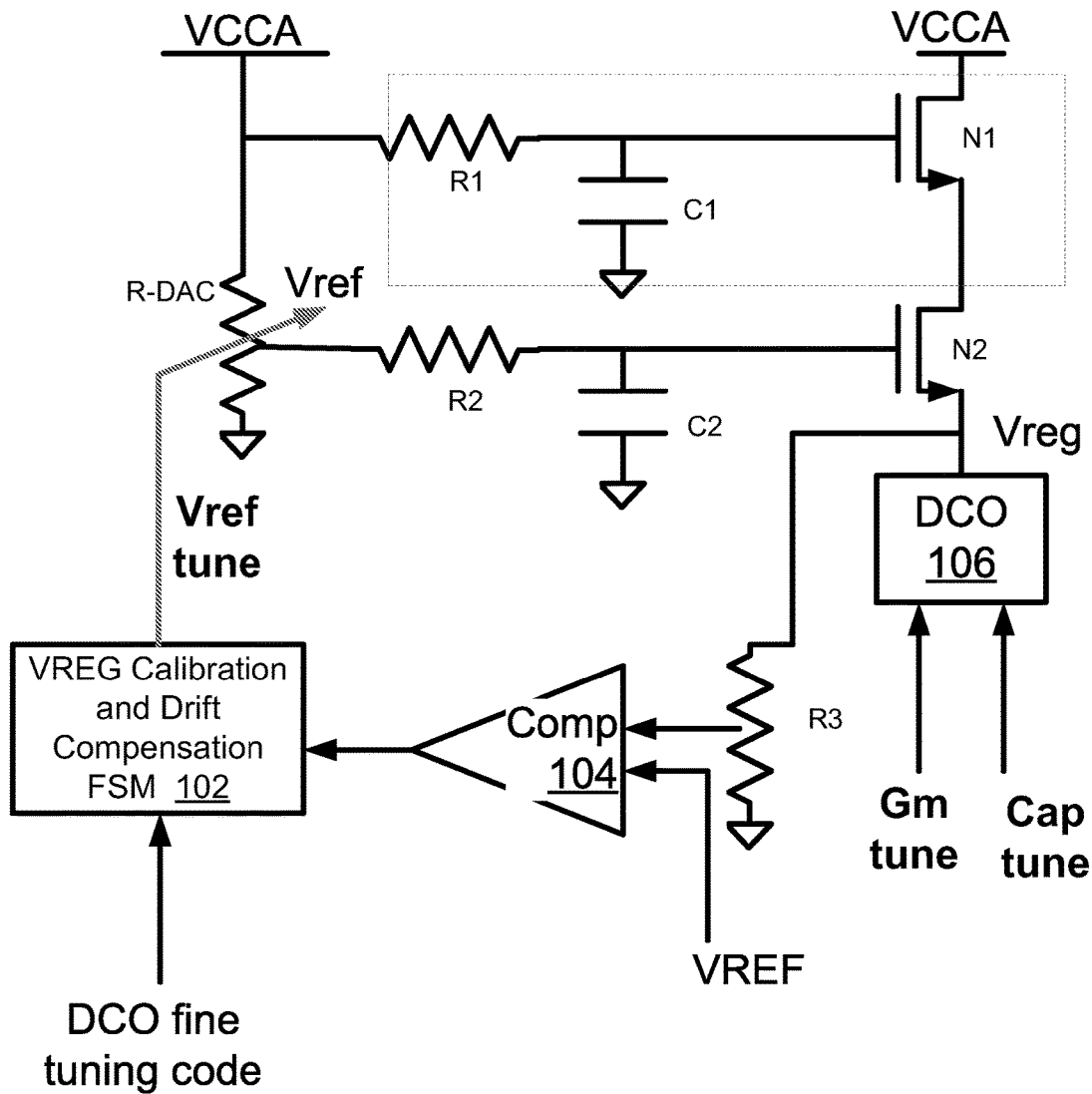
FIG. 1 shows a conventional cascaded regulator approach for mitigating the adverse effects of high Kvcc in a ring oscillator circuit.

FIG. 1 shows a prior art solution using a voltage regulation and drift compensation technique to provide a filtered supply for the oscillator (DCO 106). With this circuit, a two-stage cascaded NMOS (N1, N2) regulator is used for supplying power to the DCO 106. Noise is filtered through high frequency RC filters formed from R1, C1 and R2, C2. Comparator 104, calibration block 102, variable tuning resistor R-DAC, and resistor divider R3 regulate the oscillator supply (Vreg) against a reference voltage (VREF). In some implementations, it may provide 40+ dB PSRR while contributing negligible noise.

Unfortunately, a limitation of this topology is that VccA of the regulator input needs to be high enough to allow the regulated voltage (Vreg) to be reasonably high (say 1.0 volt). For applications where VccA is only 1.2-1.3 volts (or less), the topology has limited head-room, and may not be a good fit for high-speed applications.

Figure 2:
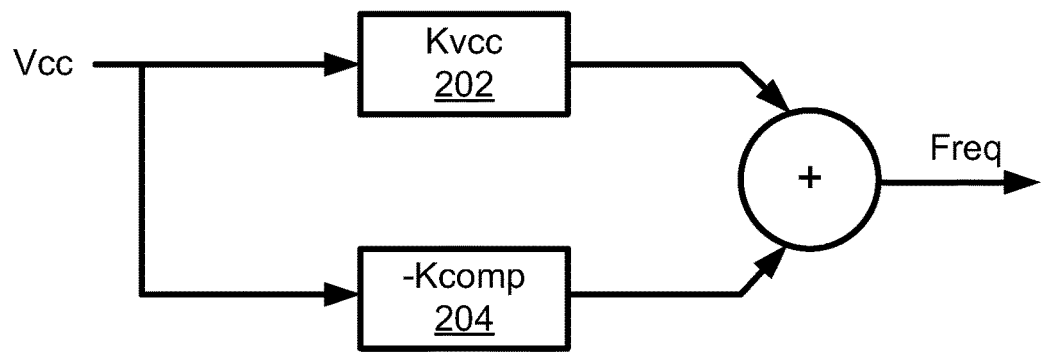
FIG. 2 conceptually illustrates a conventional approach for mitigating high Kvcc using K compensation.

With their high Kvcc values, ring oscillators have an extreme positive supply to frequency relationship. Even a tiny change in Vcc will cause a correspondingly significant change in oscillator frequency. With this in mind, and with reference to FIG. 2, some approaches attempt to offset this with negative K compensation circuits to sufficiently reduce the positive Kvcc. This is conceptually shown in FIG. 2 with the positive Kvcc 302 offset by a negative K compensation block 204. By calibrating Kcomp, the overall supply sensitivity may be reduced. Unfortunately, K compensation is a feed-forward methodology. Calibrating Kcomp to match exactly with Kvcc can require meticulous calibration. It may be a big challenge to get good calibration accuracy across PVT. In addition, generating a negative Kcomp of a reasonable magnitude may be limited also by circuit topology and oscillator frequency.

Figure 3:
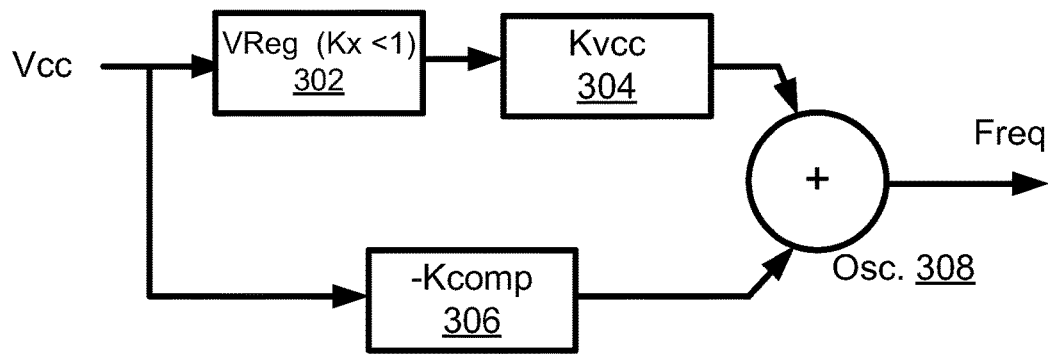
FIG. 3 conceptually illustrates an approach for mitigating against the adverse effects of high Kvcc in accordance with some embodiments.

With reference to FIG. 3, a new approach combining both of these techniques is provided. On the main path, the Vcc noise is attenuated using a lower profile voltage regulator 302 (requiring lower overhead for smaller supplies) to reduce the supply noise. A partial Kcomp compensation block 306 is also used to reduce oscillator supply sensitivity. The merit is at least two-fold. First, the Kcomp compensation range is reduced (not enough to completely offset Kvcc 304), but Kvcc is also effectively attenuated by Kx (VReg), which is <<1 (for example, Kx=0.1). Second, a coarse negative compensation reduces the PSRR requirement on the regulator. Thus, this approach eases both the regulator and compensator parameters that would otherwise be required.

Figure 4:
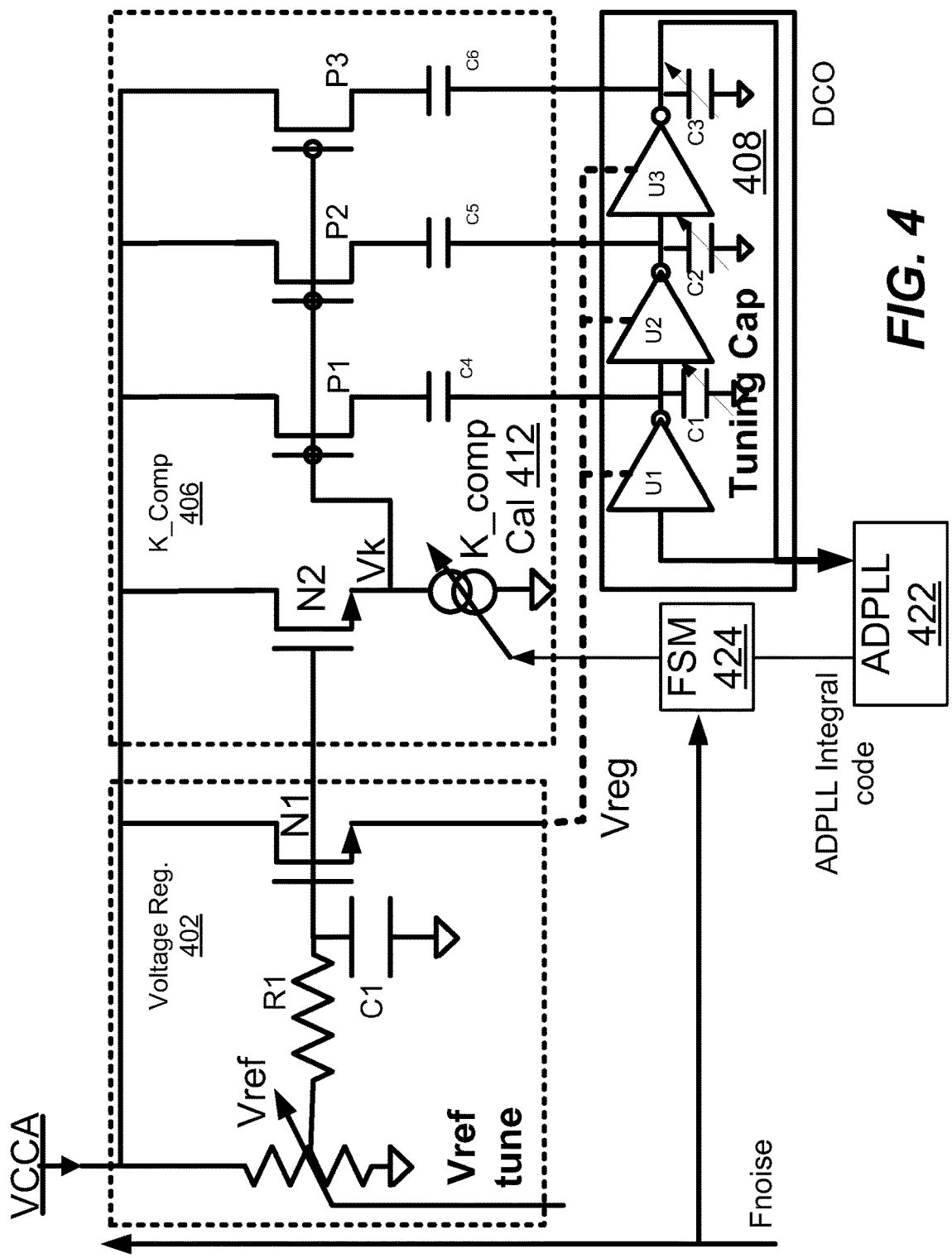
FIG. 4 is a diagram showing a regulated, compensated oscillator in a digital PLL in accordance with some embodiments.

FIG. 4 shows an oscillator with reduced noise sensitivity in accordance with some embodiments. It may be particularly well suited for high frequency IO (e.g., 25 G Ethernet, PCIe, etc.) applications with low noise requirements. The circuit generally comprises a voltage regulator 402, a K compensation block 406, ring oscillator 408, ADPLL block 422, and control logic (e.g., FSM) 424, all coupled together as shown. The ADPLL (all digital PLL) block 422 generally refers to DPLL blocks (phase comparator, filter, control, etc.), apart from the oscillator, for implementing a DPLL. The FSM logic 424, which may be part of the DPLL control/calibration functionality, may be used for tuning the K compensation block 406. Phase locked loops may be implemented in various different ways with different features and functionality. Accordingly, the invention should not be limited to any particular overall PLL configuration.

The oscillator 408 (DCO in this case) is a three-stage ring oscillator. Each stage (U1, U2, U3) comprises an inverter. This simple structure can allow for high-frequency operation (e.g., 10 GHz and above). (Note that the Kvcc of this type of oscillator is about K*f0, where K is 1 to 2, and f0 is the DCO center frequency. For example, Kvcc may vary from 12 to 24 GHz/Volt, for a center frequency of 12 GHz. The DCO also includes varactors (C1, c2, C3) for digitally tuning the oscillator.)

The voltage regulator comprises an N-type transistor N1 (e.g., NMOS) with an RC-filter (R1, C1) to provide a more regulated, and filtered, supply Vreg. Unlike with cascaded regulators, this embodiment uses a single transistor stage, thereby allowing it to operate better with a lower VCCA (e.g., 1 or 1.2 V). While it is simple in design, It can still provide around 20 dB PSRR at frequencies higher than the bandwidth (e.g., 10×) of the RC-filter.

Changes in VCCA (due to noise not completely filtered by the regulator) without the included Kcomp circuit may cause the oscillator frequency to unacceptably fluctuate because the inverters run faster with larger supplies and slower with smaller supplies. As a counter measure, the Kcomp compensation circuit 406 employs load capacitors (C4, C5, and C6) coupled to the inverters through P-type (e.g., PMOS) transistors (P1, P2, P3) to increase capacitive load with the increase of VCCA, thus compensating for at least some of the frequency increase that would otherwise occur. The load capacitors (C4-C6) should be less than the oscillator tuning capacitors (C4-C6). For example, they may be 5 to 10 times less than the tuning capacitors. In one exemplary embodiment, load capacitors C4-C6 may be about 10 fF, while tuning capacitors (varactors) may be at nominal values of 70 to 90 fF.

The series transistors (P1, P2, P3) function as variable resistors. In some embodiments, transistor N2 is a replica of N1. This is to share the RC filter of the regulator. The voltage at the source of N2 is therefore filtered by R1, C1 and is stable. Also, changes in voltage Vk reasonably track changes in Vreg, which supplies power to the oscillator inverters. Thus, VCCA noise modulates the gate-to-source voltages of transistors P1-P3, and thus, their resistances change accordingly with changing VCCA. This causes the load capacitances (C1, C2, C3), as seen by the inverters, to go up (decreasing oscillator frequency) when VCCA increases and to go down (increasing oscillator frequency) when VCCA decreases. Hence, the compensator 406 provides a negative supply sensitivity. Note that KComp Cal 412 is an adjustable current source, which can be adjusted to calibrate nominal value of Vk, and thus, to calibrate the Kcomp block 406.

Figure 5:
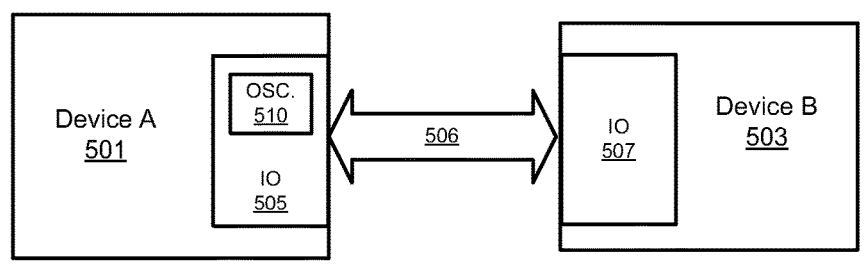
FIG. 5 is a block diagram showing devices coupled together through a communications link in accordance with some embodiments.

FIG. 5 generally shows first and second devices, Device A (501) and Device B (503) coupled together through a communications link 506. Device A includes IO interface 505 including one or more regulated and compensated oscillators 510, as taught herein. For example, it may be part of a DPLL for providing an IO interface clock. Similarly, Device B includes a corresponding IO interface 507 for communicating with Device A. In some embodiments, Devices A and B correspond to computing device chips (e.g., SoC, hub, processor, etc.).

With some embodiments discussed herein, Vcc may be reduced (e.g., less than 1.3 V). The prior-art in FIG. 1 has excellent noise performance, and high-PSRR, but it requires a higher supply voltage due to the cascaded NMOS regulator. A charge-pump circuit may even be required to provide sufficient voltage head-room. In addition, inverter based ring-oscillators have simple topologies, and can offer high operation speed. This approach allows for the use of small loading caps for Kvcc compensation purposes, which means that the oscillator core can be kept small, a key for high-speed operation.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art.

Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit, comprising:
a first node to provide a supply voltage for the circuit;
a ring oscillator comprising inverters, wherein the ring oscillator includes a second node which is to receive a power supply for the ring oscillator;
a power supply voltage regulator with a non-cascade transistor connected to the first node and the second node for powering the ring oscillator; and
a compensation circuit to provide to the ring oscillator a variable capacitive load that is dependent on the supply voltage at the first node, wherein the compensation circuit is to drag oscillator frequency down when the supply voltage on the first node goes up.

2. The circuit of claim 1, wherein the power supply voltage regulator comprises an RC filter.

3. The circuit of claim 1, in which the variable capacitive load is controlled through a replica transistor of the non-cascade transistor from the regulator.

4. The circuit of claim 1, in which the ring oscillator is part of a DCO.

5. The circuit of claim 1, in which the ring oscillator comprises tuning capacitors for controllably adjusting the oscillator frequency.

6. The circuit of claim 5, in which the tuning capacitors when at the height of their range are at least 5 times greater than the variable capacitive load when seen substantially by the ring oscillator.

7. The circuit of claim 1, in which at least one P-type transistor is coupled between the first node and the variable capacitive load to control how much capacitance is seen by the ring oscillator.

8. An apparatus, comprising:
a processor having an IO interface including a PLL circuit that includes:
a first node to provide a supply voltage for the circuit;
a ring oscillator comprising inverters, wherein the ring oscillator includes a second node which is to receive a power supply for the ring oscillator;
a power supply voltage regulator with a non-cascade transistor connected to the first node and the second node for powering the ring oscillator; and
a compensation circuit to provide to the ring oscillator a variable capacitive load that is dependent on the supply voltage at the first node, wherein the compensation circuit is to drag oscillator frequency down when the supply voltage on the first node goes up; and
a network interface device coupled to the processor through the 10 interface to couple the processor to a network.

9. The apparatus of claim 8, wherein the power supply voltage regulator comprises an RC filter.

10. The apparatus of claim 8, in which the variable capacitive load is controllable through a replica transistor of the non-cascade transistor from the regulator.

11. The apparatus of claim 8, in which the ring oscillator is part of a DCO.

12. The apparatus of claim 8, in which the ring oscillator tuning capacitors for controllably adjusting the oscillator frequency.

13. The apparatus of claim 12, in which the tuning capacitors when at the height of their range are at least 5 times greater than the variable capacitive load when seen substantially by the ring oscillator.

14. The apparatus of claim 8, in which at least one P-type transistor is coupled between the first node and the variable capacitive load to control how much capacitance is seen by the ring oscillator.

15. The apparatus of claim 8, in which the processor is an SoC.

16. An apparatus comprising:
an oscillator;
a power supply voltage regulator comprising:
a input supply node to receive an input power supply;
an output supply node to provide an output power supply, wherein the output supply node is connected to a power supply node of the oscillator;
a transistor connected to the input and output supply nodes; and
a tunable resistor coupled to a gate terminal of the transistor via a filter;
a circuit to receive an output of the filter and to adjust loading conditions of a stage of the oscillator, wherein the circuit is to drag oscillator frequency of the oscillator when the input power supply on the input supply node goes up; and
a logic to control operation of the circuit.

17. The apparatus of claim 16, wherein the oscillator is a digitally controlled oscillator (DCO).

18. The apparatus of claim 16 comprises a phase locked loop (PLL) circuit coupled to the oscillator.

19. The apparatus of claim 16, wherein the circuit is to increase loading condition of the stage when the input power supply on the input supply node rises.

20. The apparatus of claim 16, wherein the transistor is a non-cascade n-type transistor.

21. An apparatus comprising:
a input supply node to receive an input power supply;
an output supply node to provide an output power supply, wherein the output supply node is to be connected to a power supply node of an oscillator;
a non-cascade transistor connected to the input and output supply nodes;
a tunable resistor coupled to a gate terminal of the non-cascade transistor via a filter; and
a circuit to receive an output of the filter and to adjust loading conditions of a stage of the oscillator, wherein the circuit is to drag oscillator frequency of the oscillator when the input power supply on the input supply node goes up.

22. The apparatus of claim 21, wherein the non-cascade transistor, tunable resistor and the filter are part of a power supply voltage regulator.

23. The apparatus of claim 21, wherein the filter is to couple to a series combination of a transistor and a compensation circuit.

24. The apparatus of claim 23, wherein the transistor is coupled to another transistor which is coupled in series with a capacitor, and wherein the capacitor is coupled to the oscillator.

25. The apparatus of claim 21 comprises:
a logic to control operation of the circuit.

* * * * *